(12) United States Patent
Ao

(10) Patent No.: US 9,500,690 B2
(45) Date of Patent: Nov. 22, 2016

(54) RADIO FREQUENCY AND MICROWAVE IMAGING WITH A TWO-DIMENSIONAL SENSOR ARRAY

(71) Applicant: Lenovo Enterprise Solutions (Singapore) Pte. Ltd., Singapore (SG)

(72) Inventor: Eric R. Ao, Ottawa (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 463 days.

(21) Appl. No.: 14/074,232

(22) Filed: Nov. 7, 2013

(65) Prior Publication Data

US 2015/0123672 A1    May 7, 2015

(51) Int. Cl.
| | |
|---|---|
| *G01R 31/08* | (2006.01) |
| *G01R 31/302* | (2006.01) |
| *G01R 31/00* | (2006.01) |
| *G01R 29/08* | (2006.01) |

(52) U.S. Cl.
CPC ......... *G01R 31/001* (2013.01); *G01R 29/0814* (2013.01)

(58) Field of Classification Search
CPC  G01R 31/309; G01R 31/315; G01R 31/302; G06K 9/26; G06K 9/325; G06T 7/0012
See application file for complete search history.

(56) References Cited

U.S. PATENT DOCUMENTS

| | | | |
|---|---|---|---|
| 5,218,294 A * | 6/1993 | Soiferman ........... | G01R 31/315 324/763.01 |
| 5,714,888 A * | 2/1998 | Naujoks .............. | G01R 31/308 324/501 |
| 6,108,073 A | 8/2000 | Shido | |
| 6,834,380 B2 | 12/2004 | Khazei | |
| 7,136,274 B2 * | 11/2006 | Hwang ................. | H01G 4/40 174/255 |
| 7,209,291 B2 * | 4/2007 | Hanson ................ | G01P 3/36 250/227.11 |
| 7,409,116 B1 | 8/2008 | Mackie et al. | |
| 7,554,352 B2 | 6/2009 | Huie | |
| 8,131,056 B2 | 3/2012 | Polonsky et al. | |
| 8,823,406 B2 * | 9/2014 | Bolt .................... | G01J 1/0242 250/228 |

FOREIGN PATENT DOCUMENTS

CA    2264328 A1    3/1999

OTHER PUBLICATIONS

Iwanami, "Electromagnetic Field Visualization System for IC/Package Design Based on Optical Techniques", Jisso and Production Technologies Research Laboratories, NEC Corporation, provided in the search report dated Mar. 5, 2013, pp. 1-24.

\* cited by examiner

*Primary Examiner* — Minh N Tang
(74) *Attorney, Agent, or Firm* — Zilka-Kotab, PC

(57) ABSTRACT

Embodiments of the present invention disclose a method, computer program product, and system for imaging radio and microwave electromagnetic radiation using a two-dimensional sensor array. A computing system receives a readout signal from one or more of a plurality of frequency sensors, arranged in a two-dimensional array, that have the ability to detect an image of focused radio and microwave frequency radiation. The computing system maps the readout signal of each of the plurality of sensors to a location corresponding to the physical location of the sensor on the two-dimensional array. The computing system converts the readout signal into a computer readable image.

20 Claims, 5 Drawing Sheets

RADIO FREQUENCY AND MICROWAVE IMAGING WITH A TWO-DIMENSIONAL SENSOR ARRAY

FIELD OF THE INVENTION

This disclosure relates generally to electromagnetic wave detection and more specifically to detecting radio frequency and microwave radiation by imaging the source with a two-dimensional sensor array.

BACKGROUND OF THE INVENTION

Manufactured electronic products may have limits on the amount of electromagnetic radiation that they are allowed to emit. For example, governmental regulations define maximal electromagnetic radiation emission limitations. Part of these limitations are focused on the radio frequency and microwave (hereinafter RF) portion of the electromagnetic spectrum. Therefore, one part of product design includes ensuring that the electronic circuitry has minimal RF emission and that the emissions are confined inside of an enclosure. Ensuring that emissions are confined inside of an enclosure involves detecting possible leakages, or gaps, in the enclosure from which RF radiation can escape.

Current techniques for detecting such gaps include using a "sniffer" to detect leakages. A sniffer is a single antenna that can receive RF radiation. If the sniffer detects RF radiation, the antenna outputs a signal to a spectral analyzer or an oscilloscope. As the sniffer moves over the surface of the enclosure, the strength of the signal varies, allowing the operator to determine the precise location of the leakage. Scanning an entire electrical device with a sniffer can be time consuming and expensive. The sniffer also cannot take an instantaneous image of the RF emissions from the device.

Another current technique for detecting RF leakage includes a "scanner." In a scanner setup, an antenna sensitive to RF frequencies remains stationary and the device under test (DUT) rests on a moveable table. The table moves beneath the antenna. This method can be used to generate an image of the RF emission profile of the DUT, but it is time consuming as the operator must wait for the table to move so that each point of interest on the DUT passes beneath the antenna. A scanner is unable to produce an instantaneous image of the RF emission profile of the DUT.

SUMMARY

Embodiments of the present invention disclose a method, computer program product, and system for imaging radio and microwave electromagnetic radiation using a two-dimensional sensor array. A computing system receives a readout signal from one or more of a plurality of frequency sensors, arranged in a two-dimensional array, wherein the plurality of frequency sensors has the ability to detect radio and microwave frequency radiation emitted from an electrical device and wherein the detected radiation is focused into an image using a focusing mechanism. The computing system maps the readout signal of each of the plurality of sensors to a location corresponding to the physical location of the sensor on the two-dimensional array. The computing system converts the readout signal into a computer readable image.

DETAILED DESCRIPTION

Embodiments of the present invention recognize that limiting the RF emission from electrical devices is an important part of designing enclosures for the electrical devices. RF emissions are governmentally regulated and can interfere with electronics outside of the enclosure if RF leaks are not eliminated from the device. Therefore, efficient and effective methods of detecting RF emissions from an electronic device are necessary to prevent electrical interference between devices. RF radiation can be detected using an RF antenna attached to an oscilloscope or a spectral analyzer. Embodiments of the present invention include an RF focusing device and an array of RF antennas that can be used to take an RF snapshot of the device, similar to a photograph. The RF snapshot can then be compared to the device to determine the location of potential RF radiation leaks from the device enclosure.

Figure 1:
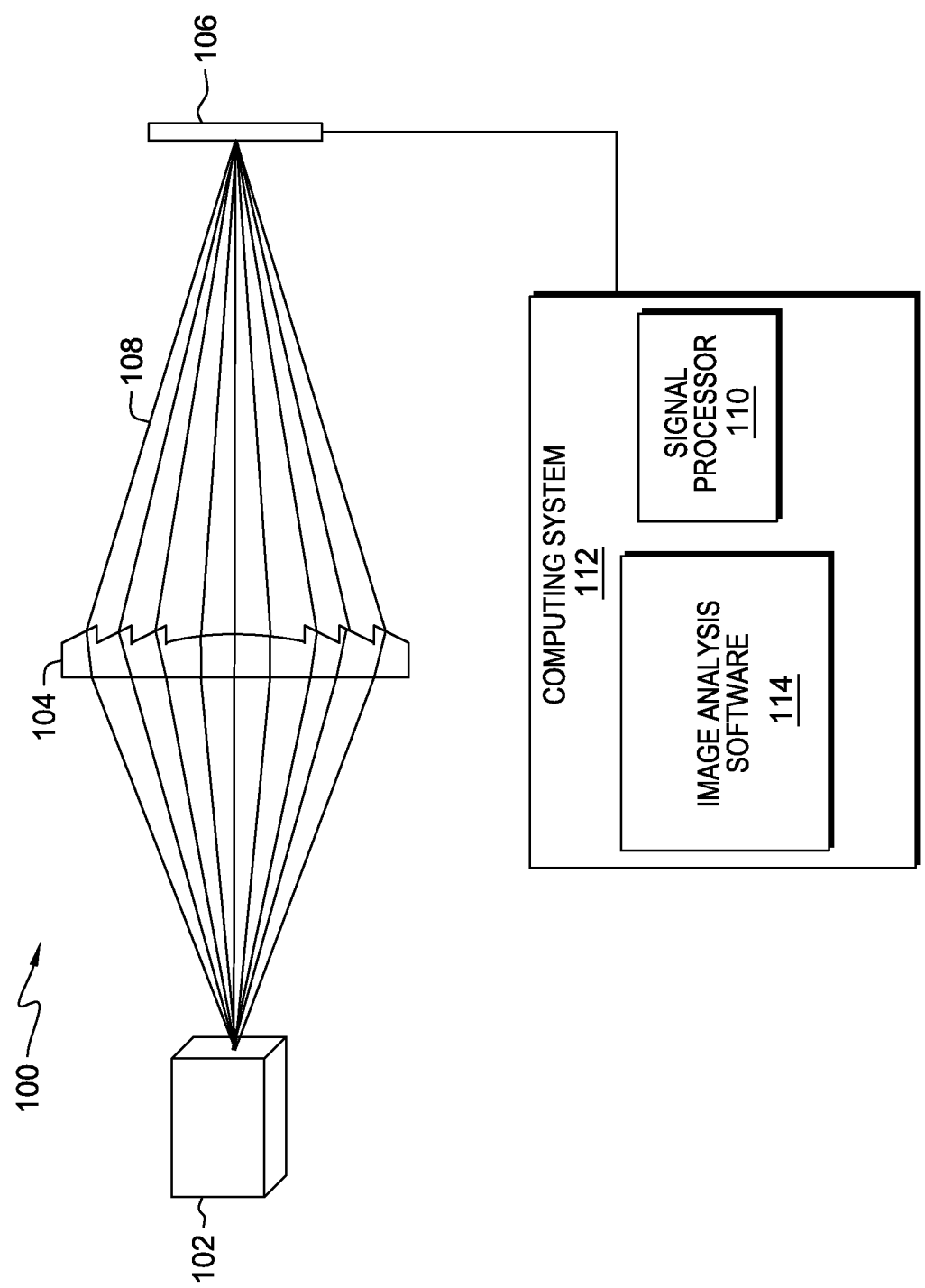
FIG. 1 is a block diagram depicting an apparatus for imaging an RF source in accordance with an embodiment of the present invention.

The present invention will now be described in detail with reference to the Figures. FIG. 1 is block diagram depicting an apparatus for imaging an RF source, generally designated 100, in accordance with an embodiment of the present invention.

In the embodiment depicted in FIG. 1, device under test 102 (DUT) emits RF or microwave radiation 108 (hereinafter RF radiation), represented as rays. DUT 102 can be any electronic device encased in an enclosure that emits RF radiation when turned on, such as an integrated circuit (IC), microcontroller, or microprocessor. Many electronic devices give off RF radiation as a byproduct of the internal electronics of the device. When electronic devices use alternating current at radio frequencies in the circuit, the oscillating electrons emit radiation in the form of electromagnetic waves with a frequency corresponding to the frequency of the alternating current. Some of this radiation can escape from the device enclosure and can interfere with external electronics. RF radiation 108 ranges from about 3 kHz to about 300 GHz.

RF radiation 108 passes through focusing device 104. Focusing device 104 can be any optical device that can serve to focus RF radiation 108. In the embodiment depicted in FIG. 1, focusing device 104 is a Fresnel lens. A Fresnel lens is useful for focusing light through a larger aperture and with a shorter focal length than traditional lenses. In another embodiment, focusing device 104 is a Fresnel zone plate. Focusing device 104 creates an image of DUT 102 in the RF spectrum range at the focal point of focusing mechanism 104.

Sensor array 106 is a two-dimensional array of RF sensors located at the focal point of focusing device 104. Sensor array 106 includes a number of RF sensors, for example RF antennas, arranged in a predetermined pattern and electronically interconnected to receive and transmit electrical current if an antenna detects RF radiation. In an embodiment, the sensors included in sensor array 106 are selected based on the frequency of radiation emitted from DUT 102 and the polarization of the radiation emitted from DUT 102. For example, the sensors can be made of exposed wire of a length appropriate for detecting RF radiation.

Sensor array 106 is electrically connected to computing system 112. Computing system 112 processes the readout signal received from sensor array 106 by mapping the signals from individual sensors to locations on a two-dimensional image. Computing system 112 includes image analysis software 114 which displays the two-dimensional image it generates on a display such as an oscilloscope, spectral analyzer, or monitor. Computing system 112 may be a laptop computer, tablet computer, netbook computer, personal computer (PC), a desktop computer, a personal digital assistant (PDA), a smart phone, or any programmable electronic device capable of communicating with signal processor 110. Computer system 112 may include internal and external hardware components, as depicted and described in further detail in FIG. 5.

Computing system 112 includes signal processor 110, which in turn includes electrical components that address electrical signals received from individual sensors in sensor array 106. For example, signal processor 110 can include a pre-amp addressing component for each sensor in sensor array 106. If a sensor in sensor array 106 detects a radio wave, the sensor sends an electrical signal to the pre-amp addressing component which then associates the signal with the location of the sensor that detected the radio wave relative to the other sensors in the array. When all of the sensor outputs are displayed on a single graph according to the location assigned by signal processor 110, a visualization of the RF image detected by sensor array 106 can be displayed on an external display.

In another embodiment, signal processor 110 includes a band-pass filter that is calibrated to filter out undesired signal frequencies in order to reduce signal noise. In another embodiment, signal processor 110 includes an analog-digital converter in order to convert the analog output of sensor array 106 into digital signals to be displayed as an image. As one skilled in the art will appreciate, the cable connectors used in signal array 106 and signal processor 110 are made of material capable of carrying the frequency of radiation being detected by signal array 106. For example, coaxial cables such as SMA or BNC connectors can be used to carry the unprocessed, analog signal from sensor array 106 to signal processor 110.

Figure 2:
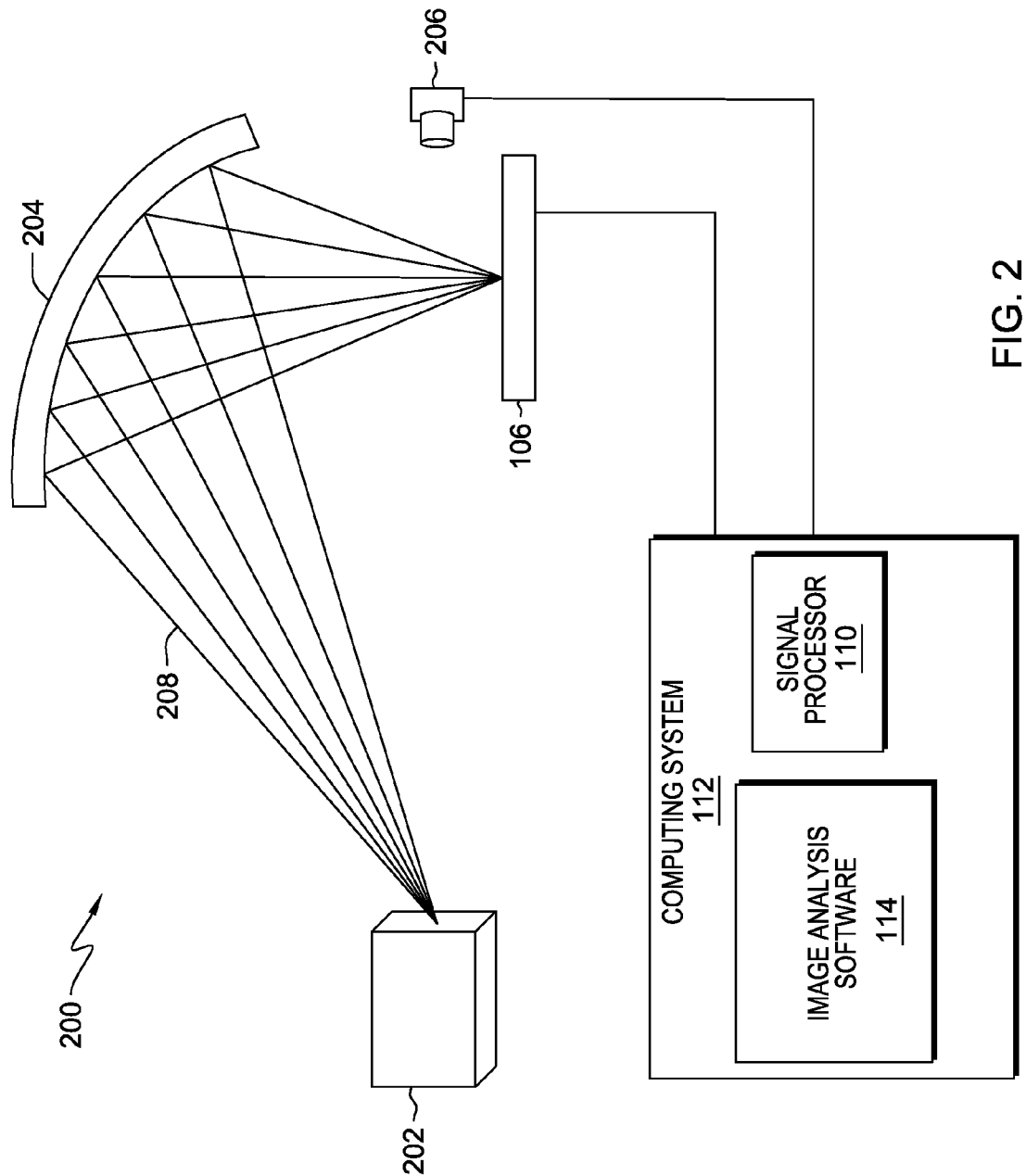
FIG. 2 is a block diagram depicting an apparatus for imaging an RF source in accordance with an embodiment of the present invention.

FIG. 2 is a block diagram depicting an apparatus, generally designated 200 for imaging an RF source in accordance with an embodiment of the present invention. DUT 202 emits RF radiation 208. RF radiation 208 reflects off of a focusing, elliptical mirror 204. Mirror 204 has two focal points. DUT 202 is located at one focal point. Two-dimensional sensor array 106 is located at the other focal point. Sensor array 106 connects to signal processor 110. Signal processor 110 delivers the RF image to the rest of computing system 112. Camera 206 is an optical camera capable of taking an image of DUT 202 in the visible range of the electromagnetic spectrum. Camera 206 connects to computing system 112 by, for example, a USB cable.

In an illustrative embodiment, DUT 202 emits RF radiation 208. DUT may be any electronic device encased in an enclosure such as an integrated circuit (IC), microcontrollers, or microprocessors. RF radiation 208 reflects off of mirror 204. In an embodiment, mirror 204 is an elliptical mirror. An elliptical mirror is a concave reflecting surface with two focal points, located at the foci of the ellipse. In the exemplary embodiment, DUT 202 is located at the first focal point of mirror 204. Sensor array 106 is located at the second focal point of mirror 204. In the exemplary embodiment, all RF radiation emitted from DUT 202 that contacts mirror 204 focuses on the surface of sensor array 106, generating an RF image of DUT 202. As will be appreciated by one of skill in the art, mirror 204 can be made of any material that reflects RF radiation. Mirror 204 can also be any shape that focuses light waves into a real image at a determinable point in space.

As discussed above, sensor array 106 outputs electrical signals received by individual antennas into computing system 112, which includes signal processor 110. Signal processor 110 includes electrical devices for addressing signals received from individual sensors so that an image of the signals can be shown on a display. Signal processor 110 can also include an analog-to-digital converter which creates a digital image of the RF radiation received from DUT 202. Computing system 112 may be a laptop computer, tablet computer, netbook computer, personal computer (PC), a desktop computer, a personal digital assistant (PDA), a smart phone, or any programmable electronic device. Computer system 112 may include internal and external hardware components, as depicted and described in further detail in FIG. 5.

Camera 206 is an optical camera capable of taking an image of DUT 202 in the visible region of the electromagnetic spectrum, such as a CCD camera. Camera 206 outputs the image of DUT 202 in the visible spectrum to computing system 112. Computing system 112 includes image analysis software 114 which overlays the processed output from signal processor 110 over the image received from camera 206. By overlaying the images, a RF radiation "heat map" of DUT 202 is generated in order to determine what area of DUT 202 is emitting RF radiation.

Overlaying the RF image on the visible image is particularly useful in the RF range because of a physical limitation on the ability of optical systems to distinguish between closely spaced objects. There is a minimum angle of separation, called a resolving angle, that must exist between two objects in order for an imaging device, such as sensor array 106, to distinguish between the two objects. For the present invention, the two objects are points on DUT 202 that emit RF radiation. Because the resolving angle depends on the wavelength of the radiation being detected, RF radiation, which has a long wavelength in comparison to other types of electromagnetic radiation, is particularly susceptible to being unable to resolve the sources of radiation. By overlaying the RF image over the visible light image, the resolution of the image can be improved in order to determine where the RF radiation is originating on DUT 202.

Figure 3:
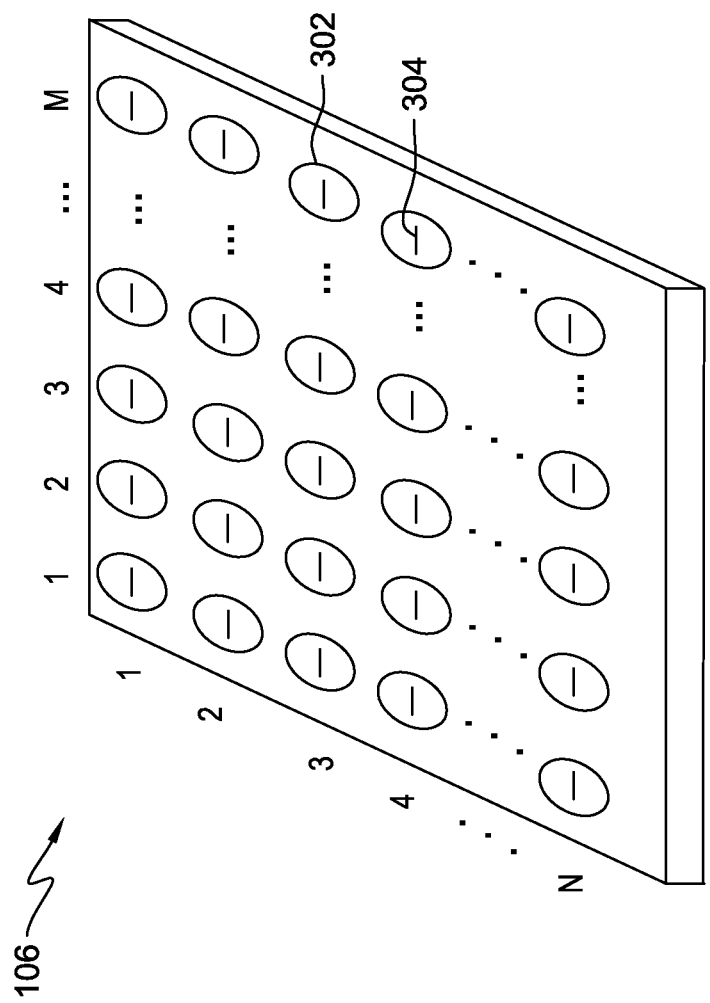
FIG. 3 depicts a two-dimensional array of RF sensors for imaging an RF source.

FIG. 3 depicts two-dimensional array 106 of RF sensors for imaging an RF source. In an exemplary embodiment, sensor array 106 comprises a plurality of RF sensors 302. Sensor 302 comprises an antenna 304 which can be an exposed wire sensitive to RF radiation. For example, sensor 302 can consist of an exposed core wire of a coaxial cable such as an SMA or BNC cable. The plurality of sensors 302 are arranged in two-dimensional sensor array 106 so that an RF image generated on sensor array 106 is detected in two dimensions. In an illustrative embodiment, sensors 302 are arranged into an array having N rows and M columns.

Antenna 304 can be any material that can receive RF radiation and output an electrical signal based on the radiation it receives. For example, antenna 304 can be an exposed wire, such as a copper wire. The selection of the antenna material and length depends on the wavelength and intensity of the RF radiation being detected. For example, the exposed wire antenna 304 acts as a monopole antenna. A monopole antenna is designed to detect radiation that has a wavelength approximately four times the length of the antenna. For example, a 0.25 m antenna would best detect RF radiation with a wavelength of 1 m or a frequency of approximately 300 MHz.

Antenna 304 is oriented and shaped to detect the particular type of RF radiation emitted from DUT 102. RF radiation may be polarized, which refers to the direction of the electric field of the propagating electromagnetic waves. Polarization may be, for example, linear, circular, or elliptical. Linear polarization means that all electric fields in the electromagnetic wave are aligned in a single plane at all times. Circular and elliptical polarization means that at any given plane in space, all electric fields are oriented in the same plane, but that plane evolves over time. In order for antenna 304 to detect RF radiation 108, the antenna must be oriented in the same plane as the electric field of RF radiation 108. In an embodiment where the radiation is linearly polarized, an antenna comprising a single wire, oriented in the same direction as the radiation will detect the radiation. In another embodiment, the radiation is linearly polarized, but the direction of the polarization is not known. In this embodiment, antenna 304 can be made of two wires, crossed at 90 degrees so that no matter the orientation of the polarization, the antenna will detect the RF radiation. In another embodiment, the radiation is circularly polarized. In this embodiment, antenna 304 can be spiral shaped to detect the circularly polarized radiation.

Figure 4:
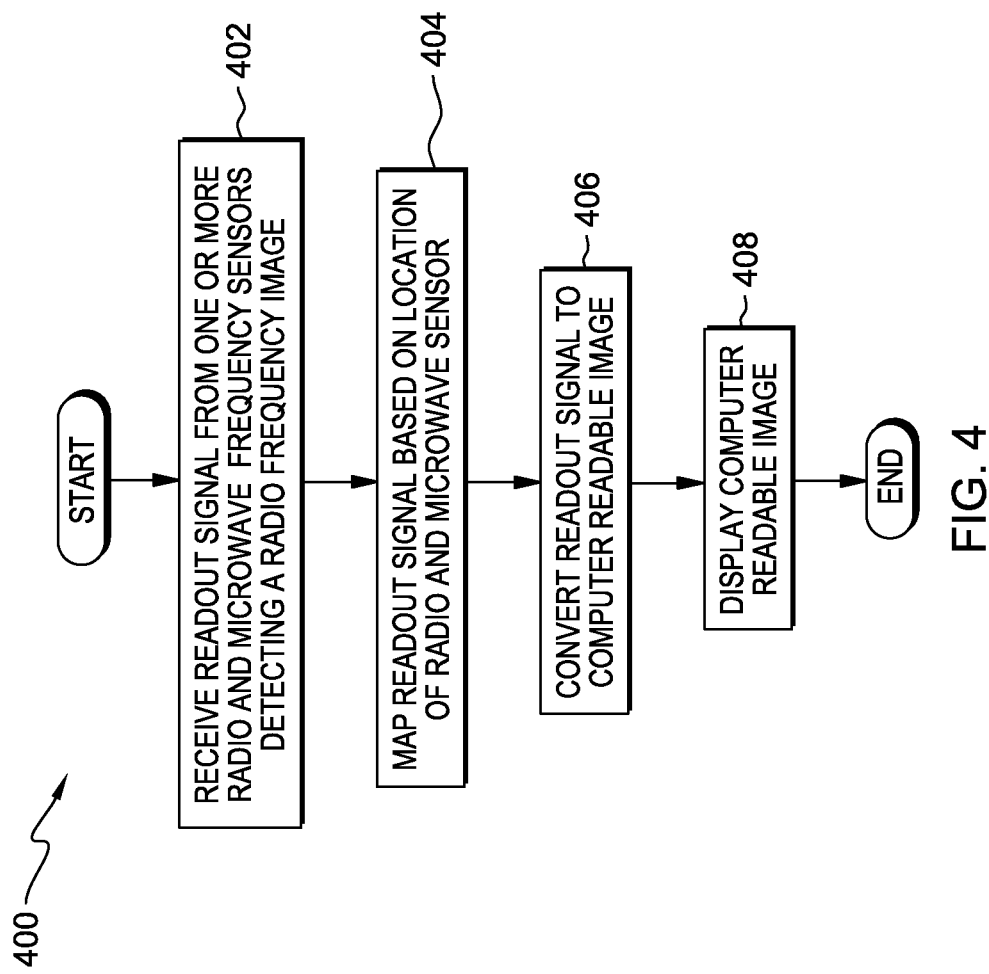
FIG. 4 is a flowchart depicting operational steps of an embodiment of the present invention.

FIG. 4 is a flowchart, generally designated 400, depicting operational steps of an embodiment of the present invention.

Computing system 112 receives a readout signal from one or more radio and microwave sensors detecting a radio frequency image (step 402). The readout signal is an electrical signal caused by the electrons in antenna 304 oscillating due to the electric field of RF radiation 108. The readout signal may be analog or digital. The cable for carrying the readout signal is selected based on the frequency of RF radiation being detected. For example, SMA cables allow frequencies of up to 18 GHz while BNC cables allow for frequencies of up to 4 GHz.

Signal processor 110 maps the readout signal to a location in an image based on the location of the radio and microwave sensor that detected the readout signal (step 404). As discussed above, signal processor 110 comprises electronics for determining the location of the sensor that delivered the readout signal such as a signal address controller. Each physical sensor sending a readout signal corresponds to a location in an image generated by computing system 112 and signal processor 110. In one embodiment, a broadband preamplifier amplifies the RF signal received by each antenna. A signal address controller determines the location of each sensor and whether a signal was detected by each sensor.

Computing system 112 converts the readout signal and location information into a computer readable image (step 406). In one embodiment, computing system 112 converts the readout signal to an image file, such as JPEG, GIF, or BMP. Computer system 112 converts the readout signal to a computer readable image file by converting the analog signal received from two-dimensional sensor array 106 into a digital signal. All digital signals are compiled into a single file comprising the mapped readout signals.

The computer readable image is displayed (step 408). The computer readable image can be displayed on, for example, an oscilloscope, a spectral analyzer, a CRT display, or an LCD display. The displayed image represents a visible depiction of the RF image detected by sensor array 106.

Figure 5:
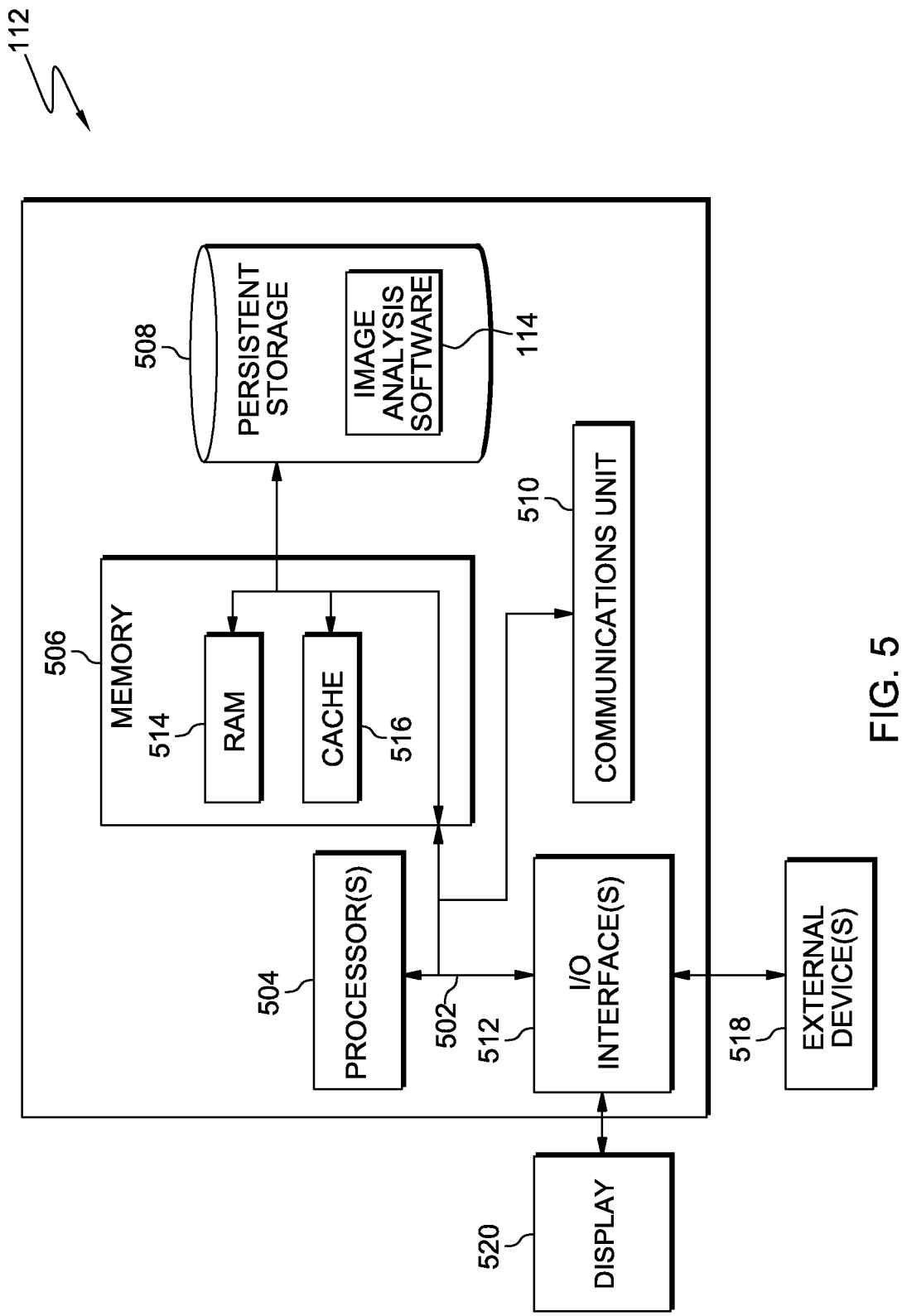
FIG. 5 is a block diagram of components of an exemplary computing system for implementing embodiments of the present invention.

FIG. 5 is a block diagram of components of computing system 112 for implementing embodiments of the present invention. It should be appreciated that FIG. 5 provides only an illustration of one implementation and does not imply any limitations with regard to the environments in which different embodiments may be implemented. Many modifications to the depicted environment may be made.

Computing system 112 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Image analysis software 114 is stored in persistent storage 408 for execution by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Image analysis software 114 may be downloaded to persistent storage 408 through communications unit 410.

I/O interface(s) 512 allows for input and output of data with other devices that may be connected to host computing system 102. For example, I/O interface(s) 512 may provide a connection to external devices 518 such as camera 206, signal processor 110, a keyboard, a keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., image analysis software 114, can be stored on such portable computer-readable storage media and can be loaded onto persistent storage 508 via I/O interface(s) 512. I/O interface(s) 512 also connect to a display 520. Display 520 provides a mechanism to display data to a user and may be, for example, a computer monitor.

What is claimed is:

1. A method for imaging radio and microwave electromagnetic radiation using a two-dimensional sensor array, the method comprising:
   receiving a readout signal from each of a plurality of frequency sensors, arranged in a two-dimensional array, wherein the plurality of frequency sensors have the ability to detect radio and microwave frequency radiation emitted from an electrical device and wherein the detected radiation is focused into an image using a focusing mechanism;
   mapping the readout signal of each of the plurality of sensors to a location corresponding to the physical location of the sensor on the two-dimensional array; and
   converting the readout signal into a computer readable radiation image utilizing the mapping, such that the computer readable radiation image displays the readout signal of each of the plurality of sensors on a single graph according to the physical location of each sensor on the two-dimensional array.

2. The method of claim 1, wherein the focusing mechanism is a Fresnel lens.

3. The method of claim 1, wherein the focusing mechanism is a Fresnel plate.

4. The method of claim 1, wherein the focusing mechanism is an elliptical mirror.

5. The method of claim 1, further comprising: processing the readout signal using a band pass filter.

6. The method of claim 1, wherein the plurality of frequency sensors is comprised of antennas having one or more wires oriented in a spiral shape to detect circularly polarized radiation.

7. The method of claim 1, further comprising:
   carrying the readout signal from each of the plurality of frequency sensors to a signal processor to perform the mapping, utilizing a cable allowing frequencies of up to 18 GHz;
   receiving from an optical camera an image of the electrical device in a visible region of an electromagnetic spectrum; and
   overlaying the computer readable radiation image onto the image of the electrical device in the visible region of an electromagnetic spectrum to generate a heat map of the electrical device.

8. A computer program product for imaging radio and microwave electromagnetic radiation using a two-dimensional sensor array, the computer program product comprising:
   one or more computer-readable storage media and program instructions stored on the one or more computer-readable storage media, the program instructions comprising:
   program instructions to receive a readout signal from each of a plurality of frequency sensors, arranged in a two-dimensional array, wherein the plurality of frequency sensors have the ability to detect radio and microwave frequency radiation emitted from an electrical device and wherein the detected radiation is focused into an image using a focusing mechanism;
   program instructions to map the readout signal of each of the plurality of sensors to a location corresponding to the physical location of the sensor on the two-dimensional array;
   program instructions to convert the readout signal into a computer readable radiation image utilizing the mapping, such that the computer readable radiation image displays the readout signal of each of the plurality of sensors on a single graph according to the physical location of each sensor on the two-dimensional array.

9. The computer program product of claim 8, wherein the focusing mechanism is a Fresnel lens.

10. The computer program product of claim 8, wherein the focusing mechanism is a Fresnel plate.

11. The computer program product of claim 8, wherein the focusing mechanism is an elliptical mirror.

12. The computer program product of claim 8, further comprising: program instructions to receive an image in the visible electromagnetic spectrum of the electrical device; and program instructions to compare the readout signal with the image in the visible electromagnetic spectrum.

13. The computer program product of claim 8, further comprising: program instructions to process the readout signal using a band pass filter.

14. The computer program product of claim 8, wherein the plurality of frequency sensors is comprised of antennas having one or more wires oriented to detect polarized radiation.

15. A computer system for imaging radio and microwave electromagnetic radiation using a two-dimensional sensor array, the computer system comprising:
   one or more computer processors;
   one or more computer-readable storage media;
   program instructions stored on the computer-readable storage media for execution by at least one of the one or more processors, the program instructions comprising:
   program instructions to receive a readout signal from each of a plurality of frequency sensors, arranged in a two-dimensional array, wherein the plurality of frequency sensors have the ability to detect radio and microwave frequency radiation emitted from an electrical device and wherein the detected radiation is focused into an image using a focusing mechanism;
   program instructions to map the readout signal of each of the plurality of sensors to a location corresponding to the physical location of the sensor on the two-dimensional array;
   program instructions to convert the readout signal into a computer readable radiation image utilizing the mapping, such that the computer readable radiation image displays the readout signal of each of the plurality of sensors on a single graph according to the physical location of each sensor on the two-dimensional array.

16. The computer system of claim 15, wherein the focusing mechanism is a Fresnel lens.

17. The computer system of claim 15, wherein the focusing mechanism is a Fresnel plate.

18. The computer system of claim 15, wherein the focusing mechanism is an elliptical mirror.

19. The computer system of claim 15, further comprising: program instructions to receive an image in the visible electromagnetic spectrum of the electrical device; and program instructions to compare the readout signal with the image in the visible electromagnetic spectrum.

20. The computer system of claim 15, wherein the plurality of frequency sensors is comprised of antennas having one or more wires oriented to detect polarized radiation.

* * * * *